Figure 1:
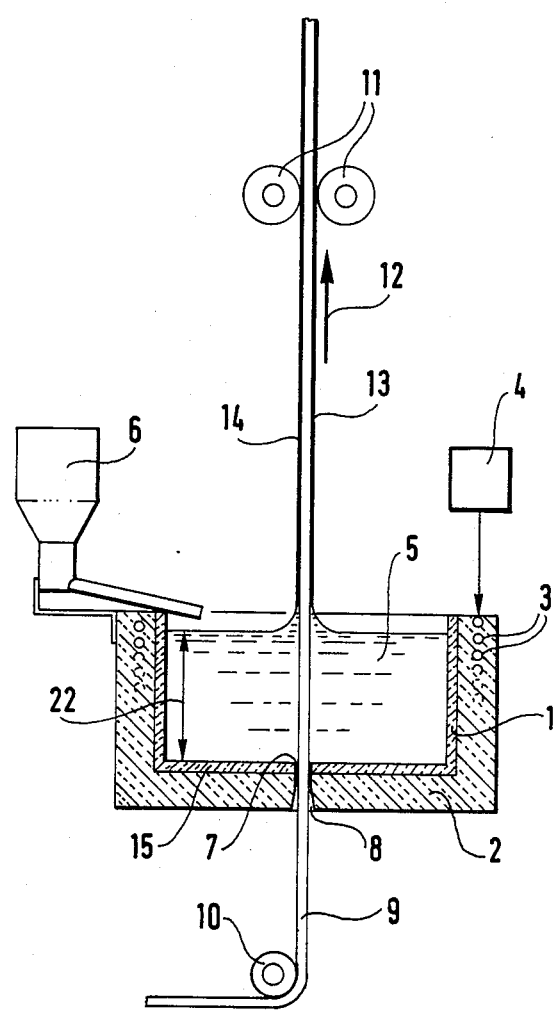

United States Patent [19]

Belouet

[11] Patent Number: 4,616,595
[45] Date of Patent: Oct. 14, 1986

[54] DEVICE FOR DEPOSITING A LAYER OF SILICON ON A CARBON TAPE

[75] Inventor: Christian Belouet, Sceaux, France

[73] Assignees: Compagnie Generale d'Electricite; Societe Nationale Elf Aquitaine, both of France

[21] Appl. No.: 800,636

[22] PCT Filed: Mar. 15, 1985

[86] PCT No.: PCT/FR85/00054

§ 371 Date: Jan. 11, 1985

§ 102(e) Date: Jan. 11, 1985

[87] PCT Pub. No.: WO85/04196

PCT Pub. Date: Sep. 26, 1985

[30] Foreign Application Priority Data

Mar. 16, 1984 [FR] France .................... 84 04074

[51] Int. Cl.⁴ ............................... B05C 3/172
[52] U.S. Cl. ........................... 118/405; 118/419
[58] Field of Search ............. 118/405, 404, 419, 401; 156/622, 624; 427/86, 434.2, 434.7

[56] References Cited

U.S. PATENT DOCUMENTS 3,429,734  2/1969  Coad .................................. 118/405
4,505,221  3/1985  Falckenberg et al. ......... 118/405 X
4,520,752  6/1985  Belouet ............................. 118/405

FOREIGN PATENT DOCUMENTS 2386359 11/1978 France ............................... 118/405

Primary Examiner—John P. McIntosh
Attorney, Agent, or Firm—Sughrue, Mion, Zinn, Macpeak, and Seas

[57] ABSTRACT

It comprises a receptacle containing a bath of molten silicon, the bottom of the receptacle includes a slot (7) through which there passes a tape (9) which is drawn vertically through the bath. The vertical wall of the slot (7) is downwardly flared, the horizontal section of the slot (7) includes a rectangular area (25) whose length is equal to the width of the tape (9) and two circular areas (28, 29) disposed at the two ends of the rectangular area (25), the diameter (32) of the circular areas (28, 29) being greater than the width of the rectangular area (25).

Application to making solar photocells from silicon.

2 Claims, 3 Drawing Figures

DEVICE FOR DEPOSITING A LAYER OF SILICON ON A CARBON TAPE

The present invention relates to a device for depositing a layer of silicon on a carbon tape, said device being of a type comprising:

a receptacle provided with a horizontal bottom having a slot passing therethrough, the horizontal profile of the slot comprising two parallel and facing straight segments, said segments delimiting a rectangular area whose length corresponds to the segments, the tape passing through the slot in such a manner that the width of the tape is parallel to the segments, means for disposing a bath of liquid silicon in the receptacle, and means for vertically drawing the tape upwardly and lengthwise in such a manner as to deposit said layer, the width of the said rectangular area being sufficiently small for the silicon meniscus connecting the tape to the walls of the slot to be stable.

A known device of this type is described in French patent specification No. 2 386 359. In this device, the slot has a rectangular horizontal section whose length is slightly greater than the width of the tape, and whose width is slightly greater than the thickness of the tape. By way of indication, for a tape which is 50 mm wide and 0.3 mm thick, the rectangular section of the slot is 50.4 mm long and 0.6 mm wide.

Such a device has a drawback. In order to avoid the tape jamming and jerking in the slot while it is being drawn therethrough, it is necessary to provide very close tolerances on the width and the alignment of the tape and also on the direction in which it is drawn. Further, it should be observed that the tape generally includes a thin protective layer of pyrocarbon: if this covering is torn off, the core of ordinary carbon in the tape is highly reactive with liquid silicon.

The aim of the present invention is to mitigate this drawback.

The present invention provides a device for depositing a layer of silicon on a carbon tape, of the above-mentioned type, characterized in that:

the wall of the slot flares outwardly at the bottom face of the bottom;

the length of the segments is equal to the width of the tape; and the horizontal profile of the slot further includes two circular curves delimiting two circular areas disposed at respective ends of the said rectangular area, each of said circular areas being centered on the longitudinal axis of the rectangular area, the circular curves connecting with the ends of the segments in such a manner that the circular areas are in communication with the rectangular area, the diameter of the circular areas being greater than the width of the said rectangular area and less than a predetermined limit value.

Figure 2:
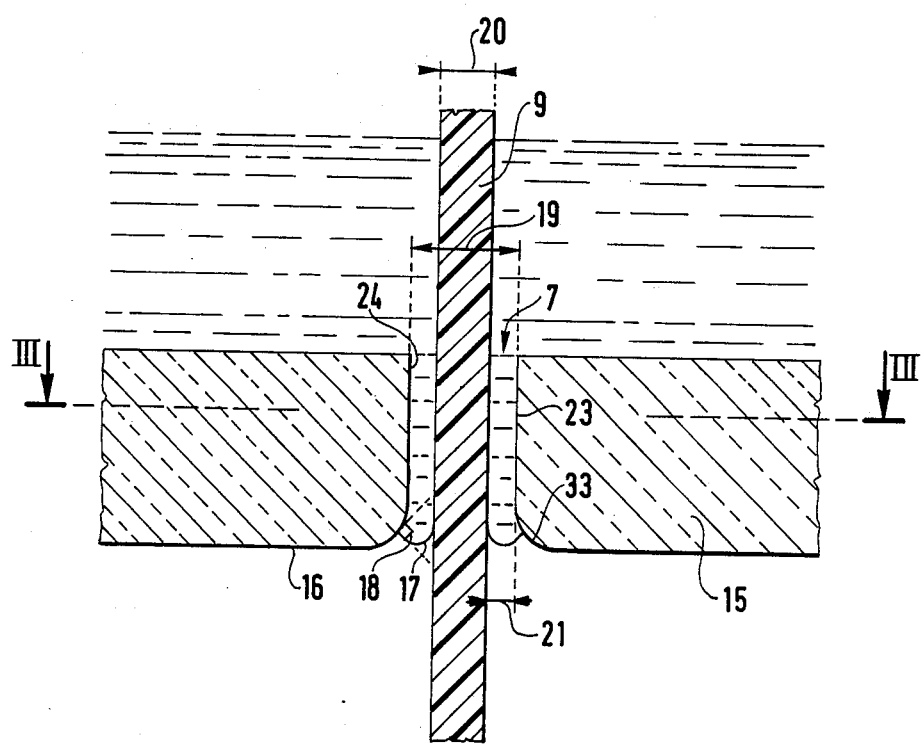
Figure 3:
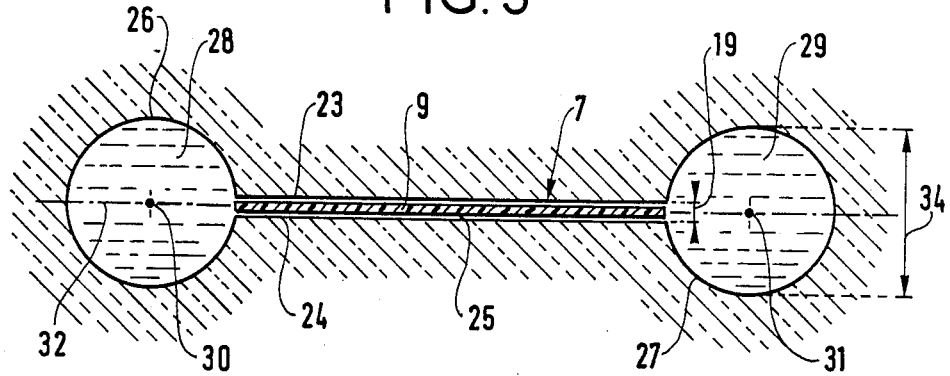

A particular implementation of the present invention is described below by way of example, with reference to the accompanying drawings, in which:

FIG. 1 is a diagram of a device in accordance with the invention for depositing a layer of silicon on a carbon tape, FIG. 2 is a vertical section view on a larger scale of a slot provided in the bottom of a receptacle constituting a part of the device shown in FIG. 1; and FIG. 3 is a horizontal section view of the slot shown in FIG. 2.

FIG. 1 is a vertical section through a quartz receptacle 1 whose walls are surrounded by an electric oven 2. The resistances 3 of the oven 2 are connected to a source of electric current 4. The receptacle 1 contains a bath 5 of liquid silicon, said bath being fed with pellets of solid silicon from a tank 6 provided with dispensing means.

The horizontal bottom 15 of the receptacle 1 includes a slot 7, and the bottom of the oven 2 is provided with an opening 8 facing the slot 7. A carbon tape 9 is slid through the slot 7 and the opening 8 so as to pass vertically through the bath of silicon 5. The figure shows the receptacle 1 in a section on a plane perpendicular to the tape 6 and substantially through the middle of the length of the slot 7. Rolls such 10 and 11 serve to draw the tape upwardly and lengthwise in the direction of arrow 12. After passing through the bath 5, the two faces of the carbon tape 9 are covered with respective layers of silicon 13 and 14. These layers may be separated from the carbon substrate and then cut up in such a manner as to obtain silicon platelets capable of being used in the manufacture of solar photoelectrical cells.

FIG. 2 is an enlarged view of the slot 7. It shows the walls 23 and 24 of the slot which are generally vertical but which have a portion 33 which is flared towards the outside of the slot. This flared portion is situated in the bottom face 16 of the receptacle bottom 15. By virtue of this disposition, the meniscus 17 of molten silicon connecting the wall of the slot to the tape 9 has a connection angle 18 relative to the flared surface of the slot which is substantially equal to 90°, thereby favoring stability of the meniscus. However, the difference between the width 19 of the slot 7 and the thickness 20 of the tape in the portion of the slot shown in FIG. 2 must be less than a maximum allowable gap which is relatively small. It is necessary to reduce the average clearance 21 between the tape and the wall of the slot to ensure that the meniscus 17 stable with an adequate safety margin and to avoid leaks of liquid silicon. The width of the slot is predetermined as a function of the thickness of the tape and the depth 22 of the silicon bath 5. By way of indication, for a bath which is two centimeters deep and for a tape which is 0.3 mm thick, and with the receptacle 1 being made of quartz, the width 19 of the slot may be 0.6 mm.

FIG. 3 is a section through the slot 7 in a horizontal plane III—III (FIG. 2) passing through the vertical walls of the slot. FIG. 3 shows that the profile of the slot 7 includes two straight segments 23 and 24 which face each other and which are parallel, said segments delimiting a rectangular area 25 whose length corresponds to the segments 23 and 24. The length of the segments 23 and 24 is equal to the width of the tape 9. The tape passes through the rectangular area 25 in such a manner that, in the plane of FIG. 3, the lines representing the main faces of the tape 9 are parallel and opposite to the segments 23 and 24.

The profile of the slot 7 further comprises two circular curves 26 and 27 which respectively delimit two circular areas 28 and 29 disposed at the two ends of the the rectangular area 25. These circular areas are centered on points 30 and 31 situated on the longitudinal axis 32 of the rectangular area 25 and beyond the rectangular area. The circular curves 26 and 27 meet the ends of the segments 23 and 24 such that the circular areas 28 and 29 are in communication with the rectangular area 25. The circular areas 28 and 29 are preferably identical in area, and their diameter 34 is not less than the width 19 of the rectangular area 25.

The diameter 34 is less than a predetermined limit value. This limit value corresponds to the maximum diameter of a circular opening provided in the bottom of a crucible containing a bath of liquid silicon and capable of ensuring a stable silicon meniscus between the sides of the circular opening. Naturally, this crucible is made from the same material as the receptacle 1 and the depth of the bath which it contains corresponds to the depth 22 of liquid silicon in the receptacle 1. Although this may appear to be surprising, the maximum diameter of this circular opening is much greater than the maximum admissible gap mentioned above between the width 19 of the rectangular area 25 and the thickness 20 of the tape 9. It should be observed on this topic that if the diameter of the circular opening is chosen to be very small, it is difficult to flare the bottom portion of the slot walls, thereby making the meniscus unstable.

By way of indication, a circular opening having a diameter of two millimeters in the bottom of a quartz receptacle can support, without leaking, a bath of liquid silicon which is two centimeters deep.

In the numerical example given above, the diameter 34 of the circular areas of the slot 7 may thus be two millimeters, which is more than three times the width (0.6 millimeters) of the rectangular area 25.

A device in accordance with the invention has the following advantages over the known device mentioned above: it enables wider tolerances to be accepted on the straightness and on the width of the carbon tape, and also on the direction in which the tape is drawn; and the risks of the tape jamming or jerking against the sides of the slot while being drawn therethrough are eliminated.

I claim:

1. A device for depositing a layer of silicon on a carbon tape, the device comprising:

a receptacle provided with a horizontal bottom having a slot passing therethrough, the horizontal profile of the slot comprising two parallel and facing straight segments, said segments delimiting a rectangular area whose length corresponds to the segments, the tape passing through the slot in such a manner that the width of the tape is parallel to the segments, means for disposing a bath of liquid silicon in the receptacle, and means for vertically drawing the tape upwardly and lengthwise in such a manner as to deposit said layer, the width of the said rectangular area being sufficiently small for the silicon meniscus connecting the tape to the walls of the slot to be stable; characterized in that the wall (23, 24) of the slot (7) flares (33) outwardly at the bottom face (16) of the bottom (15);

the length of the segments (23, 24) is equal to the width of the tape (9); and the horizontal profile of the slot (7) further includes two circular curves (26, 27) delimiting two circular areas (28, 29) disposed at respective ends of the said rectangular area (25), each of said circular areas being centered on the longitudinal axis (32) of the rectangular area (25), the circular curves (26, 27) connecting with the ends of the segments (23, 24) in such a manner that the circular areas (28, 29) are in communication with the rectangular area (25), the diameter (34) of the circular areas (28, 29) being greater than the width (19) of the said rectangular area (25) and less than a predetermined limit value.

2. A device according to claim 1, characterized in that the receptacle (1) is made of quartz, and the diameter (34) of the circular areas (28, 29) is greater than three times the width (19) of the said rectangular area (25).